United States Patent [19]

Andrade et al.

[11] 4,102,043

[45] Jul. 25, 1978

[54] PIN INSERTING APPARATUS

[75] Inventors: Ralph W. Andrade; Alexander W. Duncan, both of Clayton, N.C.

[73] Assignee: GTE Sylvania Incorporated, Stamford, Conn.

[21] Appl. No.: 870,188

[22] Filed: Jan. 17, 1978

[51] Int. Cl.[2] .......................................... H05K 3/30
[52] U.S. Cl. .................................. 29/739; 29/626; 29/757; 29/759
[58] Field of Search ................ 29/739, 741, 626, 757, 29/759

[56] References Cited

U.S. PATENT DOCUMENTS

| 3,924,325 | 12/1975 | Kufner | 29/739 X |
| 3,963,456 | 6/1976 | Tsuchiya et al. | 29/739 |

*Primary Examiner*—Carl E. Hall
*Attorney, Agent, or Firm*—Theodore D. Lindgren

[57] ABSTRACT

Apparatus for inserting electrical connecting pins or terminals into preformed holes in a circuit board, the apparatus comprised of a vibrating table means and a press means having parallel first and second plattens, a parallel intermediate platten positioned between the first and second plattens by resilient means, the first platten having perpendicularly attached stand-off posts aligned with pin guide holes in the intermediate platten and with pin clearance holes in the second platten, the first and second plattens having slidably attached positioning means for positioning the intermediate platten in two different positions during operation, a pin loading means with template having slidably attached gate means and having tapered holes, the gate means having holes alignable with the pin guide holes and the tapered holes.

1 Claim, 5 Drawing Figures

PIN INSERTING APPARATUS

FIELD OF THE INVENTION

This invention relates to apparatus for multiple insertion electrical connector pins or terminals into holes in a panel or board of the type used for printed circuits.

BACKGROUND OF THE INVENTION

One of the commonly utilized methods for providing external connecting terminals for printed circuit boards is the insertion of wire-wrap type pins or posts through preformed holes in the circuit boards. The wire-wrap type pins are often square in cross-section having a diagonal dimension greater than the diameter of the preformed holes into which they are forcibly inserted.

Prior art methods and apparatus for insertion of pins have varied starting with single insertion using hand tools or machines and developing into multiple insertion also using hand placement of pins in a template having guide holes located over a circuit board, then using a simple press to push the pins through matching holes in the circuit board until the top of the pins are flush with the template. Later development has eliminated hand placement of pins through use of a second template which has matching tapered holes and which is positioned over a template similar to that previously described. During operation using this later developed equipment both of the templates as well as the circuit board are vibrated to cause pins scattered over the second template to fall upright into the tapered holes before removing the second template and proceeding with the previously described pressing procedure.

During the pressing procedure of the methods described in the foregoing paragraph, the pins are without lateral support over the greater part of their length. A slight misalignment of a hole in the circuit board and the pins often results in bending of some of the pins during the pressing operation. The bent pins tend to bind in the template holes, making removal of the circuit board from the template difficult. The bent pins must be removed from the template with consequent slowing of the production time and the holes in the circuit board where the damaged pins were to have been permanently inserted must be filled with hand-inserted pins. In many cases, the holes are damaged to the extent that the board must be discarded.

SUMMARY OF THE INVENTION

The apparatus of this invention overcomes the deficiencies of prior art multiple pin insertion devices by providing lateral support to each pin inserted throughout the insertion process. The apparatus provides an economical and efficient method for assembly line multiple insertion of terminal pins into large circuit boards with minimal loss of time and material caused by binding of pins in template holes.

The embodiment of the invention utilizes a press means having attached first and second plattens to insert pins into preformed holes in a circuit board positioned on an intermediate platten. The intermediate platten is attached to the first platten by a resilient means. During the pressing operation, the pins are forced through to circuit board holes by stand-off posts extending perpendicularly from the first platten to the near surface of the intermediate platten, the intermediate platten having pin guide holes aligned with the stand-off posts. The second platten has pin clearance holes into which the terminal pins extend as they are forced through the circuit board during pressing operation. The resilient means allows the distance between the first platten and the intermediate platten to be decreased during the pressing operation and returns said plattens to their original position after completion of the insertion processes. A vibrating table means along with a pin loading means having a slidably attached gate means provide an efficient means for implacement of the terminal pins into the pin guide holes prior to the pin insertion pressing operation. First and second plattens are provided with slidably attached positioning means for positioning the intermediate platten in one position during the pin insertion pressing operation and in a second position during the circuit board removal pressing operation.

DESCRIPTION OF THE PREFERRED EMBODIMENT

Figure 1:
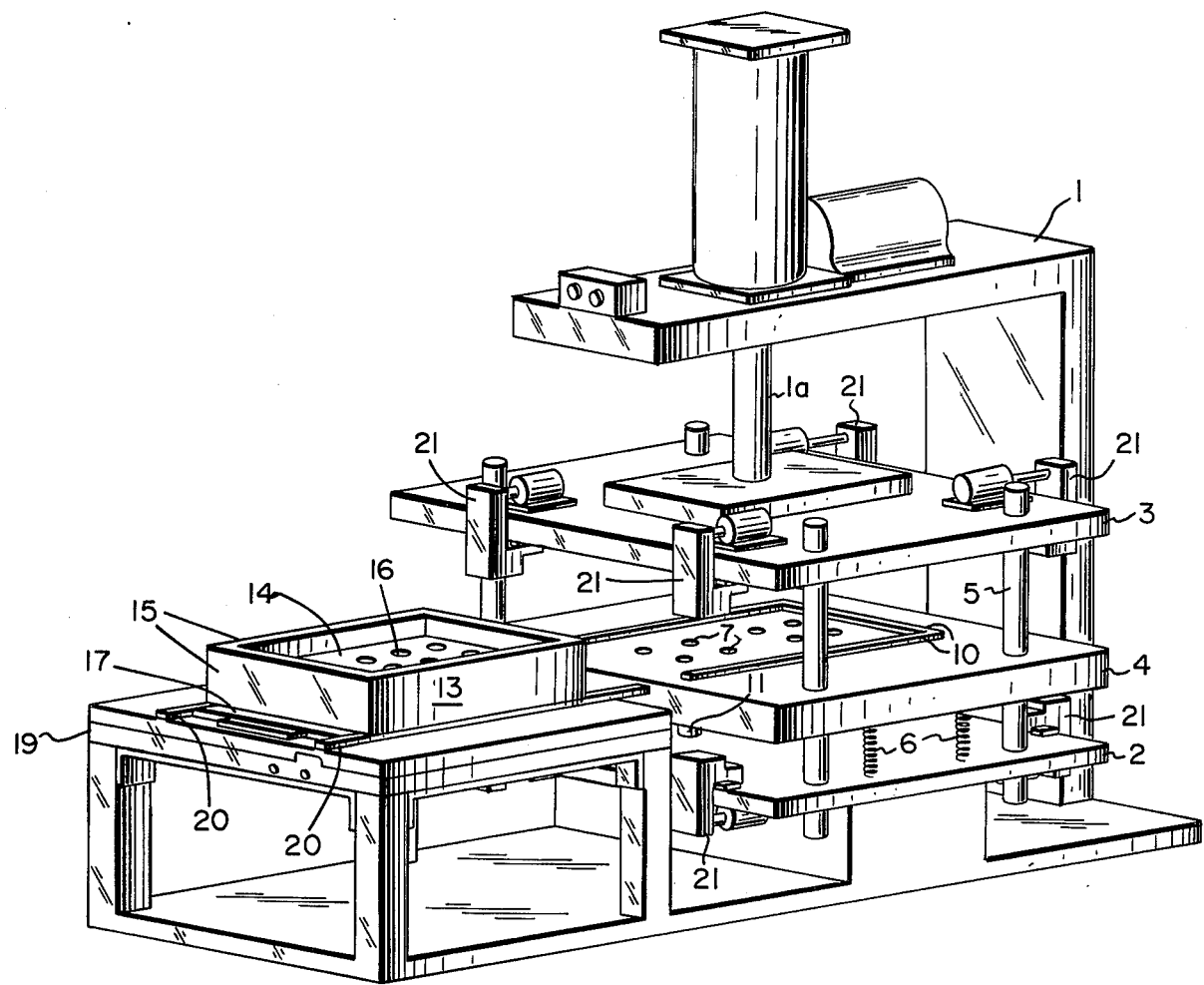
FIG. 1 is an isometric view of the apparatus of this invention.

For a better understanding of the present invention, together with other and further objects, advantages and capabilities thereof, reference is made to the following disclosure in conjunction with the accompanying drawings.

Referring to the foregoing listed drawings, press means 1 is a conventional hydraulic or pneumatic press having motor, pump, cylinder and controls for operation of a vertical driving ram 1a. Press means 1 as adapted for this invention has a first platten 2, a second platten 3 and an intermediate platten 4 which is positioned between said first and second plattens. Plattens 2, 3 and 4 are parallel to each other and are constricted to perpendicular movement during operation by guide rods 5, which extend through at least two of said plattens. Intermediate platten 3 is, during non-operating periods of time, positioned with respect to first platten 2 by resilient means 6 which are shown as a set of springs. During operation of press means 1, at least one of plattens 2 and 3 is caused to move toward the other of said plattens. The closure movement is continued until such time as the distance between first platten 2 and intermediate platten 4 has been decreased to predetermined lengths, said lengths depending upon the mode of operation performed. The foregoing closure movement causes compression of resilient means 6. The opening movement of press means 1 causes plattens 2, 3 and 4 to be returned to their original positions.

Pin guide holes 7 extend through intermediate platten 4 and are slightly greater in diameter than the maximum cross-sectional dimension of electrical connecting pins 8, said cross-section usually being square in shape. Guide holes 7 are located such that, when circuit board 9 is implaced on intermediate platten 4 adjacent to stops 10 on said platten 4, said holes 7 will be aligned with pre-drilled or preformed holes in said board 9 at desired locations for insertion of pins 8. The length of guide holes 7 is approximately equal to the length of pins 8. The proportions between length and diameter used in the drawings for holes 7 and pins 8 does not, of coruse, correspond to the proportions used in actual practice.

Stand-off posts 11 are affixed vertically to first platten 2 and extend upward therefrom to substantially the lower suface of intermediate platten 4, the length being determined by the non-operational position of said platten 4. Posts 11 are positioned to align with pin guide holes 7 in intermediate platten 4, are smaller in diameter than said guide holes 7 and are at least as long as the length of said guide holes 7.

Pin clearance holes 12 extend through second platten 3 and are also aligned with pin guide holes 7 and have substantially the same diameter as said guide holes 7. The length of said holes 12 is preferably at least equal to that part of the length of pins 8 which protrudes from boards 9 after insertion of said pins 8.

Figure 3:
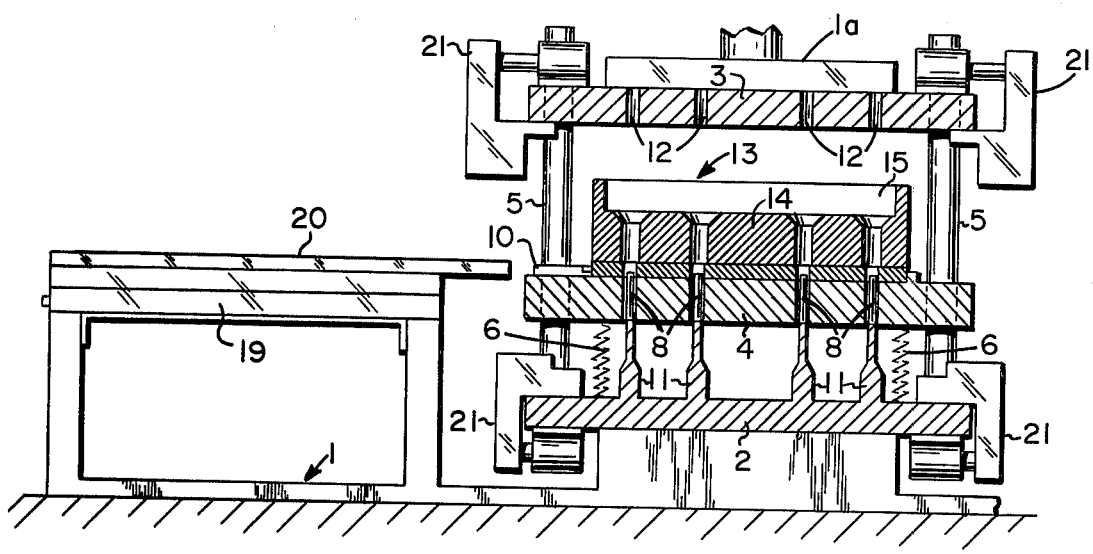
FIG. 3 is a cross-sectional view of functional elements of the invention shown during the pin placement phase of operation.

Pin-loading means 13 is comprised of a template 14 with an attached upper surrounding rim 15. Template 14 has a plurality of tapered holes extending vertically therethrough with the smaller diameter at the lower surface thereof. The holes are positioned such that, when means 13 is placed above intermediate platten 4 and adjacent to stops 10, tapered holes 16 align with at least those pin guide holes 7 which are to be used during the pin insertion process. A gate means 17 is slidably attached adjacently below said template 14 and has a plurality of gate holes 18 which extend vertically therethrough and which are slidably alignable with those tapered holes 16 and those pin guide holes 7 which are to be used in the pin insertion process. The pin placement phase of operation is illustrated in FIG. 3.

Figure 2:
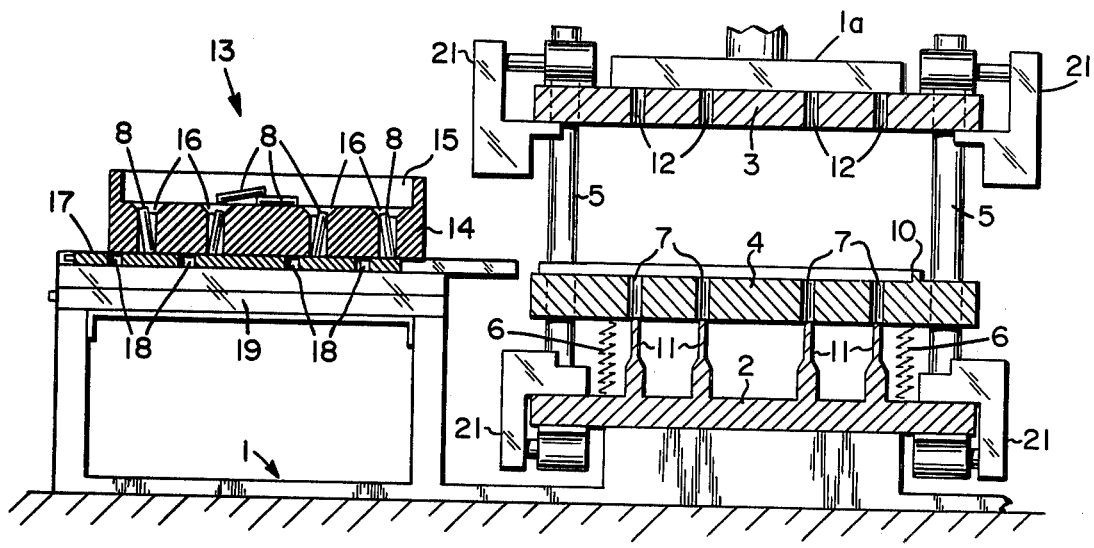
FIG. 2 is a cross-sectional view of functional elements of the invention shown during the vibration phase of operation.

Vibrating table means 19 is preferably attached to press means 1 in a manner such that the vibrating surface is located at the same level as the upper surface of intermediate platten 4. The surface of vibrating table means 19 may be furnished with rails 20 which align with two of stops 10. The vibration phase of operation is illustrated in FIG. 2.

Figure 4:
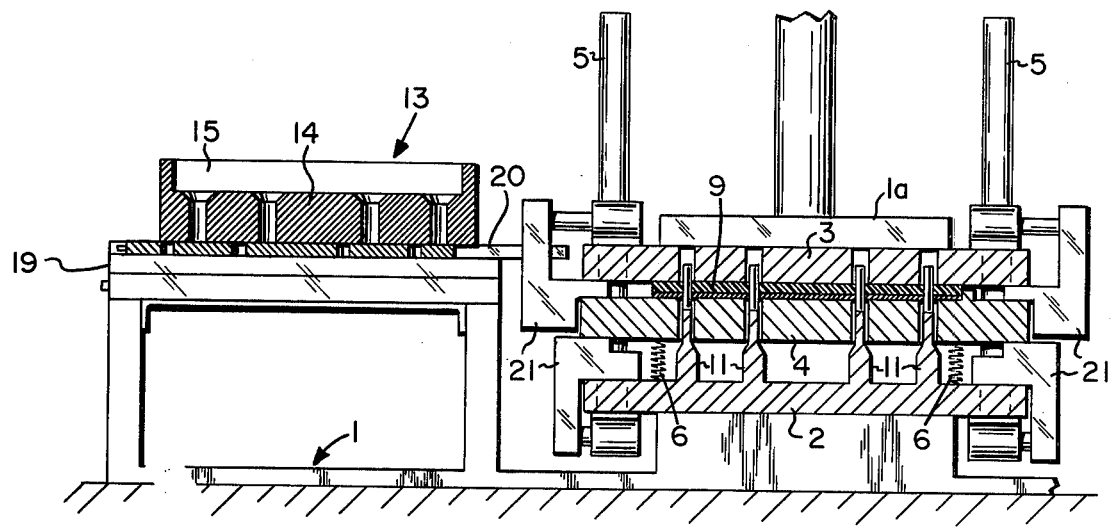
FIG. 4 is a cross-sectional view of functional elements of the invention shown during the pin insertion phase of operation.
Figure 5:
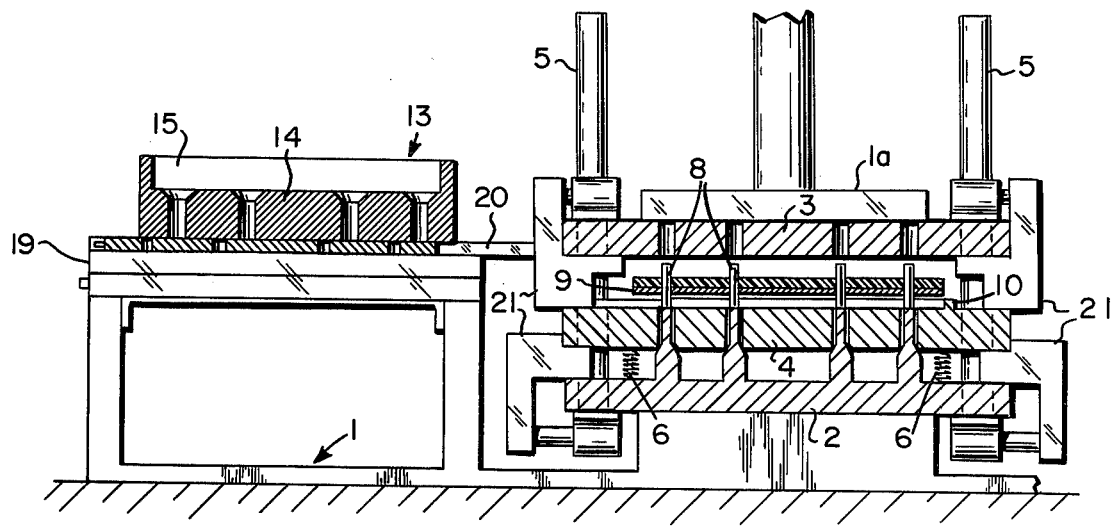
FIG. 5 is a cross-sectional view of functional elements of the invention shown during the board removal phase of operation.

Intermediate platten positioning means 21 are slidably attached to both first and second plattens 2 and 3. Means 21 function to cause intermediate platten 4 to move to either of two defined positions during operation of press means 1. One of the two positions is used during operation of press means 1 for the purpose of inserting pins 8 in board 9, as illustrated in FIG. 4. The other of the two positions is illustrated in FIG. 5 and is used during operation of press means 1 to remove board 9 from intermediate platten 4 after the pin insertion process is completed. The first position causes stand-off posts 11 to extend, during pin insertion operation, only part way through pin-guide holes 7. The other position causes stand-off posts 11 to extend, during board-removal operation, through the length of pin-guide holes 7, thereby removing the circuit board along with inserted pins including any pins which may have been wedged into holes 7 during the pin-insertion operation. Means 21 preferably includes hydraulic, pneumatic or solenoid actuating devices which cause a change of position between operating functions.

During operation of the pin insertion apparatus of this invention, circuit board 9 and a quantity of pins 8 are placed on pin-loading means 13, which is located on vibrating table means 19. During vibration on vibrating table means 19, gate means 17 is positioned to close the bottom of tapered holes 16, as illustrated in FIG. 2. Vibration is continued until such time as pins 8 have fallen into holes 16. Gate means 17 is then positioned against stops 10 on intermediate platten 4, excess pins 8 are brushed away from holes 16 and gate means 17 and template 14 are slidably operated to allow pins 8 to fall through gate holes 18 into pin guide holes 7, as illustrated in FIG. 3. Pin-loading means 13 is removed and circuit board 9 is then placed against stops 10 on intermediate platten 4. Press means 1 is operated with positioning means 21 in the proper position for pin-insertion operation. During the ensuing pin insertion operation second platten 3 presses board 9 and intermediate platten 4, causing resilient means 6 to be compressed as stand-off posts 11 cause pins 8 to extend through said board 9, as illustrated in FIG. 4. Positioning means 21 causes the pins 8 to be inserted in a manner such that after the operation said pins 8 extend from either side of the board according to predetermined lengths. Press means 1 is returned to retracted position and positioning means 21 is repositioned for board-removal operation. During the ensuing board-removal operation, positioning means 21 located on second platten 3 presses intermediate platten 4, causing resilient means 6 to be compressed as stand-off posts 11 cause pins 8 and board 9 to be separated from intermediate platten 4, as illustrated in FIG. 5. Press means 1 is retracted and board 9 with inserted pins 8 is removed for further processing in the assembly operation.

It is understood that holes 7 and 12 may be formed using bushings located in larger holes in plattens 4 and 3. It is also understood that the apparatus described may be adapted for insertion of pins in a variety of shapes and sizes of circuit boards and that certain parts of the apparatus may be formed for use with similar boards having different circuits with standardized pin locations. It will be apparent to those skilled in the art that various changes and modifications may be made in the indicated embodiment without departing from the scope of the invention as defined by the appended claim.

We claim:

1. Apparatus for inserting electrical connecting pins into holes in a printed circuit board, said holes having predetermined locations, said apparatus comprising a vibrating table means and a press means having a first platten and a parallel second platten with at least one of said first and second plattens movable in a direction perpendicular to said plattens and having a parallel intermediate platten positioned between said first and second platten by resilient means, said second platten having a plurality of pin clearance holes, said intermediate platten having a plurality of pin guide holes at least some of which are aligned with said pin clearance holes, said first platten having a plurality of stand-off posts perpendicularly affixed thereto with each of said stand-off posts aligned with one of said pin guide holes, said stand-off posts having smaller diameter than said pin guide holes and having length as great as the length of said resilient means, a pin-loading means having a gate means and a template with attached rim, said template having a plurality of tapered holes at least some of which are alignable with at least some of said pin guide holes, said gate means slidably attached to said template and having gate holes alignable with at least some of said tapered holes.

* * * * *